US011258977B2

(12) United States Patent
Lule (10) Patent No.: US 11,258,977 B2
(45) Date of Patent: Feb. 22, 2022

(54) IMAGE SENSOR READOUT METHOD AND ARCHITECTURE

(71) Applicant: STMICROELECTRONICS (GRENOBLE 2) SAS, Grenoble (FR)

(72) Inventor: Tarek Lule, Saint-Egreve (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 140 days.

(21) Appl. No.: 16/703,681

(22) Filed: Dec. 4, 2019

(65) Prior Publication Data

US 2020/0204751 A1 Jun. 25, 2020

(30) Foreign Application Priority Data

Dec. 19, 2018 (FR) ..................... 1873375

(51) Int. Cl.
*H04N 5/378* (2011.01)
*H01L 27/146* (2006.01)
*H04N 5/3745* (2011.01)
*H04N 5/353* (2011.01)

(52) U.S. Cl.
CPC ....... *H04N 5/378* (2013.01); *H01L 27/14643* (2013.01); *H04N 5/37452* (2013.01); *H04N 5/37455* (2013.01); *H04N 5/37457* (2013.01); *H04N 5/353* (2013.01)

(58) Field of Classification Search
CPC .................................................... H04N 5/378
USPC ........................................................ 348/294
See application file for complete search history.

(56) References Cited

U.S. PATENT DOCUMENTS

| 5,841,126 A | 11/1998 | Fossum et al. |
| 6,850,278 B1 | 2/2005 | Sakurai et al. |
| 2005/0046715 A1 | 3/2005 | Lim et al. |
| 2011/0037868 A1 | 2/2011 | Ota |
| 2012/0256078 A1 | 10/2012 | Mabuchi |
| 2017/0359538 A1 | 12/2017 | Kobayashi et al. |
| 2020/0068147 A1* | 2/2020 | Hayashi ............... H04N 5/3535 |

FOREIGN PATENT DOCUMENTS

| EP | 2 290 823 A1 | 3/2011 |
| EP | 3 013 037 A1 | 4/2016 |
| FR | 2 959 320 A1 | 10/2011 |

OTHER PUBLICATIONS

Snoeij et al., "A CMOS Image Sensor with a Column-Level Multiple-Ramp Single-Slope ADC," *2007 IEEE International Solid-State Circuits Conference*, Feb. 11-15, 2007, San Francisco, California, 3 pages.

* cited by examiner

*Primary Examiner* — Joel W Fosselman
(74) *Attorney, Agent, or Firm* — Seed IP Law Group LLP (57) ABSTRACT

The present disclosure relates to a readout circuit of a pixel array comprising: a first analog to digital converter coupled to a first column line of the pixel array and configured to convert a reference voltage level and a captured voltage level of a first pixel based on a first conversion gain of the first pixel; and a second analog to digital converter coupled to the first column line of the pixel array and configured to convert a reference voltage level and a captured voltage level of the first pixel based on a second conversion gain of the first pixel, the first and second conversion gains being different from each other.

20 Claims, 9 Drawing Sheets

IMAGE SENSOR READOUT METHOD AND ARCHITECTURE

CROSS-REFERENCE TO RELATED APPLICATION(S)

This application claims the priority benefit of French Patent application number 18/73375, filed on Dec. 19, 2018, the content of which is hereby incorporated by reference in its entirety to the maximum extent allowable by law.

BACKGROUND

Technical Field

The present disclosure relates to the field of image sensors, and in particular to a readout circuit for a pixel array of an image sensor.

Description of the Related Art

CMOS image sensors are based on arrays of pixels each comprising a photodiode that collects a charge during an integration period, and stores the charge at a sense node. The voltage at the sense node can then be read using a readout circuit, generally positioned at the bottom of the columns of the pixel array. The dynamic range and conversion gain of the pixel is determined in part by the size of the capacitance present at the sense node. Indeed, the pixel becomes saturated when the amount of charge collected during the integration period exceeds the charge storage capacity of the sense node.

To improve the low light performance of image sensors, the conversion gain of each pixel can be increased. This can for example be achieved by reducing the capacitance at the sense node in each pixel. However, this immediately leads to a lower full well, and thus a poorer signal-to-noise ratio (SNR).

It has also been proposed to provide pixels having two different conversion gains, a high gain for low light conditions, and a low gain for the best SNR in the mid-tones. There is however always a compromise to be made between capturing an image having a high SNR and capturing an image having good low light performance.

BRIEF SUMMARY

Some embodiments provide a readout circuit of a pixel array including: a first analog to digital converter coupled to a first column line of the pixel array and configured to convert a reference voltage level and a captured voltage level of a first pixel based on a first conversion gain of the first pixel; and a second analog to digital converter coupled to the first column line of the pixel array and configured to convert a reference voltage level and a captured voltage level of the first pixel based on a second conversion gain of the first pixel, the first and second conversion gains being different from each other.

According to some embodiments, the first analog to digital converter is coupled to the first pixel via a multiplexer and a first column line, and the second analog to digital converter is coupled to the first pixel via said multiplexer and the first column line.

According to some embodiments, the first and second analog to digital converters are ramp converters, the readout circuit further including a control circuit configured to provide a first ramp signal to the first analog to digital converter and a second ramp signal to the second analog to digital converter.

According to some embodiments, the control circuit is further configured to provide a first auto-zero signal to the first analog to digital converter, and a second auto-zero signal to the second analog to digital converter.

According to some embodiments, the readout circuit is configured to convert both the reference voltage level and captured voltage level of the first pixel based on the second conversion gain between converting the reference voltage level of the first pixel based on the first conversion gain and converting the captured voltage level of the first pixel based on the first conversion gain.

According to some embodiments, at least one of the first and second analog to digital converters includes first and second counters.

Some embodiments provide an image sensor including a pixel array including said first pixel; and the above readout circuit.

According to some embodiments, the first pixel is configured to transfer accumulated charge to a first node having a first capacitance in order to provide said first conversion gain and to transfer accumulated charge to a second node or to both the first and second nodes in order to provide said second conversion gain.

According to some embodiments, the first pixel includes a first sense node coupled to a first photodiode via a first transfer gate and a further storage node coupled to the first sense node by a first transistor.

According to some embodiments, the first pixel is capable of generating a first captured voltage level resulting from a first exposure time of the first photodiode and of generating a second captured voltage level resulting from a second exposure time of the first photodiode.

According to some embodiments, the first pixel includes a second sense node coupled to the first photodiode via a second transfer gate, wherein the first and second transfer gates are controlled by pulsed signals to transfer the charge from the first photodiode over a plurality of transfer periods.

According to some embodiments, the first pixel further includes a second photodiode of different dimensions to the first photodiode.

Some embodiments provide a method of reading a pixel array including: converting, by a first analog to digital converter coupled to a first column line of the pixel array, a reference voltage level and a captured voltage level of a first pixel based on a first conversion gain of the first pixel; and converting, by a second analog to digital converter coupled to the first column line of the pixel array, a reference voltage level and a captured voltage level of the first pixel based on a second conversion gain of the first pixel, the first and second conversion gains being different from each other.

According to some embodiments, the first and second analog to digital converters are ramp converters, the method further including providing, by a control circuit, a first ramp signal to the first analog to digital converter and a second ramp signal to the second analog to digital converter.

According to some embodiments, converting the reference and captured voltage levels includes, in sequence: converting the reference voltage level of the first pixel based on the first conversion gain; converting the reference voltage level of the first pixel based on the second conversion gain; converting the captured voltage level of the first pixel based on the second conversion gain; and converting the captured voltage level of the first pixel based on the first conversion gain.

According to some embodiments, the method further includes, while the first analog to digital converter performs the conversions of the reference and captured voltage levels of the first pixel received via a first column line, converting, by the second analog to digital converter based on the second conversion gain, a further reference voltage level and a further captured voltage level of a second pixel received via a second column line.

According to some embodiments, the first and second pixels each includes a first storage node having a first capacitance and a second storage node having a second capacitance, wherein the reference and captured voltage levels of the first pixel are read from the first storage node of the first pixel, and the further reference and captured voltage levels of the second pixel are read from the second storage node of the second pixel.

According to some embodiments, the first and second pixels further include a third storage node have a third capacitance, the method further including, while the second analog to digital converter performs the conversions of the reference and captured voltage levels of the first pixel received via a first column line, converting, by the first analog to digital converter based on the first conversion gain, another reference voltage level and another captured voltage level of the second pixel received via a second column line and read from the third storage node of the second pixel.

Some embodiments provide a readout circuit of a pixel array having an analog to digital converter including: a first capacitor coupled to a first column line of the pixel array via a first switch and configured to store a reference voltage level of a first pixel based on a first conversion gain of the first pixel; and a second capacitor coupled to the first column line of the pixel array via a second switch and configured to store a reference voltage level of the first pixel based on a second conversion gain of the first pixel, the first and second conversion gains being different from each other.

According to some embodiments, the first and second capacitors are coupled together by a third switch.

According to some embodiments, the first and second capacitors are coupled together by a third switch and a buffer.

According to some embodiments, the third switch is configured to couple the second capacitor to the first column line during a first phase and to couple the second capacitor to the first capacitor and the buffer during a second phase.

According to some embodiments, the readout circuit further includes a control circuit configured to: control the first switch to couple the first capacitor to the first column line to store the reference voltage level of the first pixel based on the first conversion gain; control the second switch to couple the second capacitor to the first column line; control the analog to digital converter to convert, into a first digital value, the reference voltage level of the first pixel based on the second conversion gain; control the analog to digital converter to convert, into a second digital value, the captured voltage level of the first pixel based on the second conversion gain; control the analog to digital converter to convert, into a third digital value, the reference voltage level of the first pixel based on the first conversion gain; control the first switch to couple the first capacitor to the first column line; and control the analog to digital converter to convert, into a fourth digital value, the captured voltage level of the first pixel based on the first conversion gain.

According to some embodiments, the analog to digital converter is a ramp converter including: a differential amplifier having: a first input coupled to the second capacitor and to a third capacitor receiving a ramp signal; and a second input coupled to a reference voltage.

According to some embodiments, the differential amplifier further includes an output coupled to the first input via a further switch.

According to some embodiments, the readout circuit further includes a control circuit configured to provide the ramp signal to the third capacitor and an auto-zero signal to the further switch.

Some embodiments provide an image sensor including a pixel array including said first pixel; and the above readout circuit.

According to some embodiments, the first pixel is configured to transfer accumulated charge to a first node having a first capacitance in order to provide said first conversion gain and to transfer accumulated charge to a second node or to both the first and second nodes in order to provide said second conversion gain.

Some embodiments provide a method of reading a pixel array using a readout circuit, the method including: controlling a first switch of an analog to digital converter of the readout circuit to couple a first capacitor to a first column line of the pixel array to store a reference voltage level of a first pixel based on a first conversion gain of the first pixel; and controlling a second switch of the analog to digital converter to couple a second capacitor to the first column line of the pixel array to store a reference voltage level of the first pixel based on a second conversion gain of the first pixel, the first and second conversion gains being different from each other.

According to some embodiments, the method further includes: controlling the analog to digital converter to convert, into a first digital value, the reference voltage level of the first pixel based on the second conversion gain; controlling the analog to digital converter to convert, into a second digital value, the captured voltage level of the first pixel based on the second conversion gain; controlling the analog to digital converter to convert, into a third digital value, the reference voltage level of the first pixel based on the first conversion gain; controlling the first switch to couple the first capacitor to the first column line; and controlling the analog to digital converter to convert, into a fourth digital value, the captured voltage level of the first pixel based on the first conversion gain.

BRIEF DESCRIPTION OF THE SEVERAL VIEWS OF THE DRAWINGS

The foregoing and other features and advantages will become apparent from the following detailed description of embodiments, given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures, or to an image capture device as orientated during normal use.

Unless specified otherwise, the expressions "around," "approximately," "substantially," and "in the order of," signify within 10%, and preferably within 5%.

Throughout the present disclosure, the term "connected" is used to designate a direct electrical connection between circuit elements, whereas the term "coupled" is used to designate an electrical connection between circuit elements that may be direct, or may be via one or more intermediate elements such as resistors, capacitors, transistors or buffers. Unless indicated otherwise, where the term "coupled" is used, the connection can be implemented by an indirect or direct connection.

Figure 1:
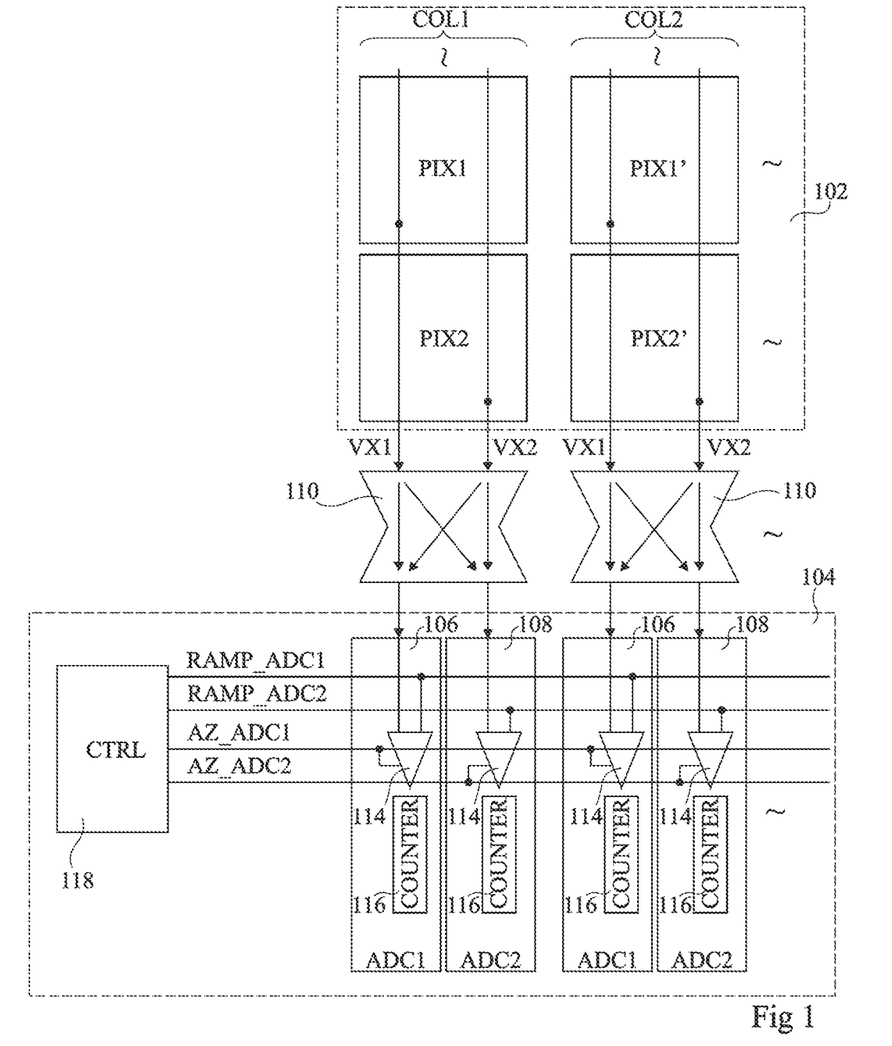
FIG. 1 illustrates part of a pixel array and of a readout circuit according to an example embodiment of the present disclosure.

FIG. 1 schematically illustrates part of a pixel array 102 and part of a readout circuit 104 of an image capture device according to an example embodiment. The image capture device for example forms part of an electronic device such as a mobile telephone or smart phone, digital camera, laptop computer, webcam, etc.

FIG. 1 includes pixels PIX1 and PIX2 of a column COL1 and pixels PIX1' and PIX2' of another column COL2 of the pixel array 102. Of course, in practice, the pixel array 102 may comprise hundreds or thousands of rows and columns of pixels. The readout circuit 104 comprises, associated with each column of pixels of the pixel array 102, a pair of analog to digital converters (ADC1, ADC2) 106, 108.

In the example of FIG. 1, each column COL1, COL2 comprises a pair of column lines VX1, VX2, and pixels of each column COL1, COL2 are coupled to the column lines VX1, VX2 in an alternating manner. For example, as shown in FIG. 1, the pixel PIX1 of the column COL1 is coupled to the column line VX1 and the pixel PIX2 of the column COL1 is coupled to the column line VX2. Similarly, the pixel PIX1' of the column COL2 is coupled to the column line VX1 and the pixel PIX2' of the column COL2 is coupled to the column line VX2. The column lines VX1 and VX2 are coupled to the inputs of the ADCs 106 and 108 via a multiplexer 110 of each column, permitting each column line VX1, VX2 to be coupled to either of the ADCs 106, 108, respectively. However, in some alternative or additional embodiments, the multiplexer 110 is omitted, and the column line VX1 of each column, e.g. COL1, is coupled to each of the pixels PIX1, PIX2 of the column and to the input of the ADC 106, and the column line VX2 of each column, e.g., COL1, is coupled to each of the pixels PIX1, PIX2 of the column and to the input of the ADC 108.

Each ADC 106, 108, for example, comprises a ramp converter comprising a comparator 114 and a counter (COUNTER) 116. One input of the comparator 114 of each ADC 106, 108 is coupled to one of the column lines VX1, VX2 via the multiplexer 110, and the other input of the comparator 114 of each ADC 106, 108 receives a corresponding ramp signal RAMP_ADC1, RAMP_ADC2. Furthermore, the comparator 114 of each ADC 106, 108 receives a corresponding auto-zero signal AZ_ADC1, AZ_ADC2. The ramp signals RAMP_ADC1, RAMP_ADC2 and auto-zero signals AZ_ADC1, AZ_ADC2 are for example generated by a control circuit (CTRL) 118.

Figure 2:
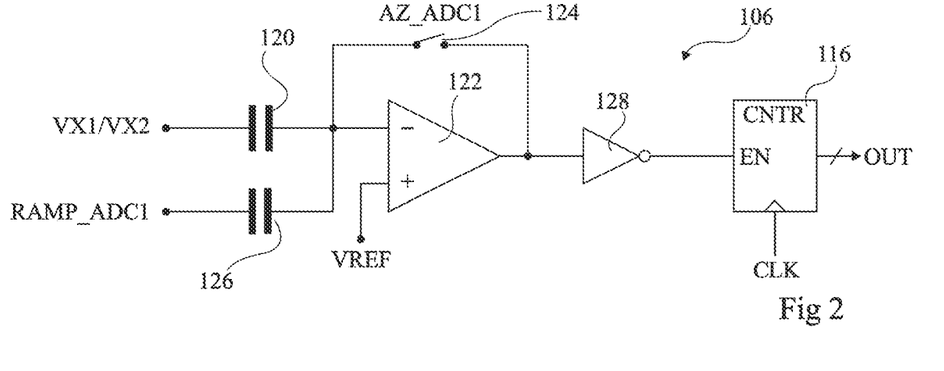
FIG. 2 illustrates an analog to digital converter of FIG. 1 in more detail according to an example embodiment.

FIG. 2 schematically illustrates the ADC 106 of FIG. 1 in more detail according to example embodiment. The ADC 108 is for example implemented by a similar circuit.

The column line VX1 or VX2, which is coupled via the multiplexer 110 to the input of the ADC 106 (or the ADC 108 for the case of VX2), is for example coupled, via an input capacitor 120, to a negative input of a differential amplifier 122, which is for example an operational amplifier. The output of the amplifier 122 is coupled via a feedback line to the negative input of the amplifier 122, the feedback line comprising a switch 124 controlled by the auto-zero signal AZ_ADC1. The negative input of the amplifier 122 is also coupled via a capacitor 126 to the input of the ADC 106 receiving the ramp signal RAMP_ADC1. The positive input of the amplifier 122 is coupled to a reference level VREF, which is for example a ground voltage of the circuit. The output of the amplifier 122 is coupled via an inverter 128 to an enable input EN of the counter (CNTR) 116, which is clocked by a clock signal CLK, and provides an output count value OUT corresponding to the digital output of the readout circuit.

Figure 3:
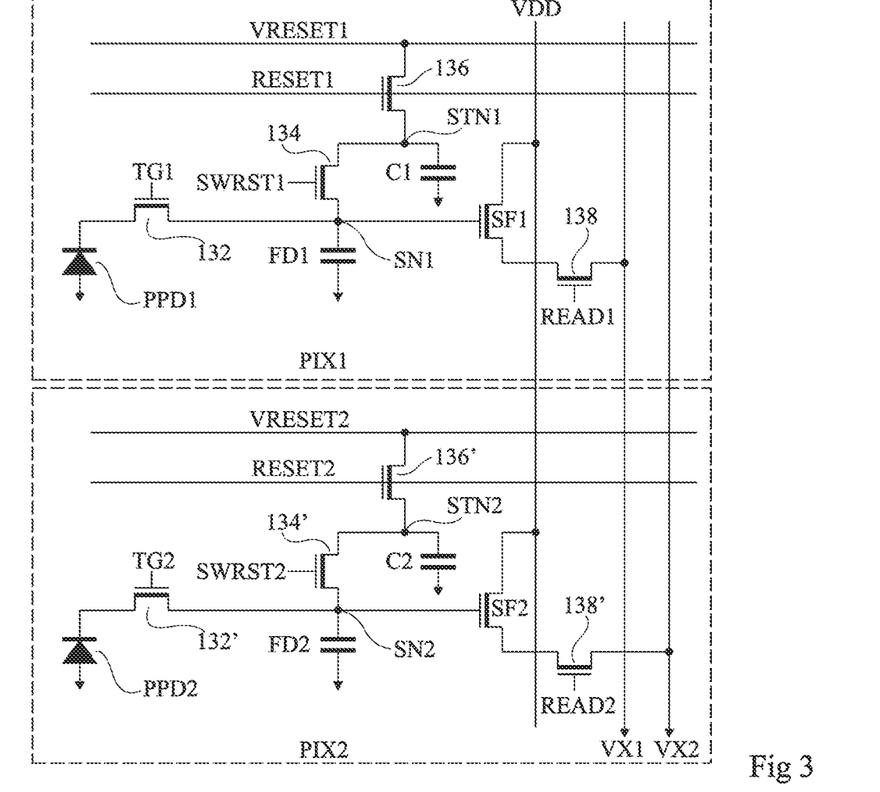
FIG. 3 illustrates pixels of the pixel array of FIG. 1 in more detail according to an example embodiment.

FIG. 3 schematically illustrates an example of the circuits implementing the pixels PIX1, PIX2, of FIG. 1.

The pixel PIX1 for example comprises a pinned photodiode PPD1 having its anode coupled to ground, and its cathode coupled, via a transfer gate 132, to a sense node SN1. The sense node SN1 has a capacitance represented by a capacitor FD1 coupled between the sense node SN1 and ground. This capacitance is for example the result of parasitic capacitances of the surrounding transistors, and may also be implemented by one or more capacitors. The sense node SN1 is also coupled to a further storage node STN1 via a transistor 134. The further storage node STN1 has a capacitance represented by a capacitor C1 coupled between the node STN1 and ground. This capacitance is for example larger than the capacitance at the sense node SN1, and is for example implemented at least in part by a capacitor. The further storage node STN1 is also coupled to a reset voltage rail VRESET1 via a further transistor 136. The sense node SN1 is further coupled to the gate of a source follower transistor SF1 having one of its main conducting nodes coupled to a supply voltage rail VDD, and the other of its main conducting nodes coupled to the column line VX1 via a read transistor 138. The transfer gate 132 is controlled by a signal TG1, and the transistors 134, 136 and 138 are respectively controlled by signals SWRST1, RESET1 and READ1. The conversion gain applied by the pixel is for example a function of the capacitance used to store the pixel value and from which it is output on the column line. Thus in the pixel PIX1, the capacitance of the sense node SN1, and the combined capacitance of the storage node STN1 and of the sense node SN1, provide two different conversion gains.

Similarly, the pixel PIX2 for example comprises a pinned photodiode PPD2 having its anode coupled to ground, and its cathode coupled, via a transfer gate 132', to a sense node SN2. The sense node SN2 has a capacitance represented by a capacitor FD2 coupled between the sense node SN2 and ground. This capacitance is for example the result of parasitic capacitances of the surrounding transistors, and may also be implemented by one or more capacitors. The sense node SN2 is also coupled to a further storage node STN2 via a transistor 134'. The further storage node STN2 has a capacitance represented by a capacitor C2 coupled between the node STN2 and ground. This capacitance is for example larger than the capacitance at the sense node SN2, and is for example implemented at least in part by a capacitor. The further storage node STN2 is also coupled to a reset voltage rail VRESET2 via a further transistor 136'. The sense node SN2 is further coupled to the gate of a source follower transistor SF2 having one of its main conducting nodes coupled to a supply voltage rail VDD, and the other of its main conducting nodes coupled to the column line VX2 via a read transistor 138'. The transfer gate 132' is controlled by a signal TG2, and the transistors 134', 136' and 138' are respectively controlled by signals SWRST2, RESET2 and READ2.

Operation of the circuits of FIGS. 1, 2 and 3 will now be described in more detail with reference to FIG. 4.

Figure 4:
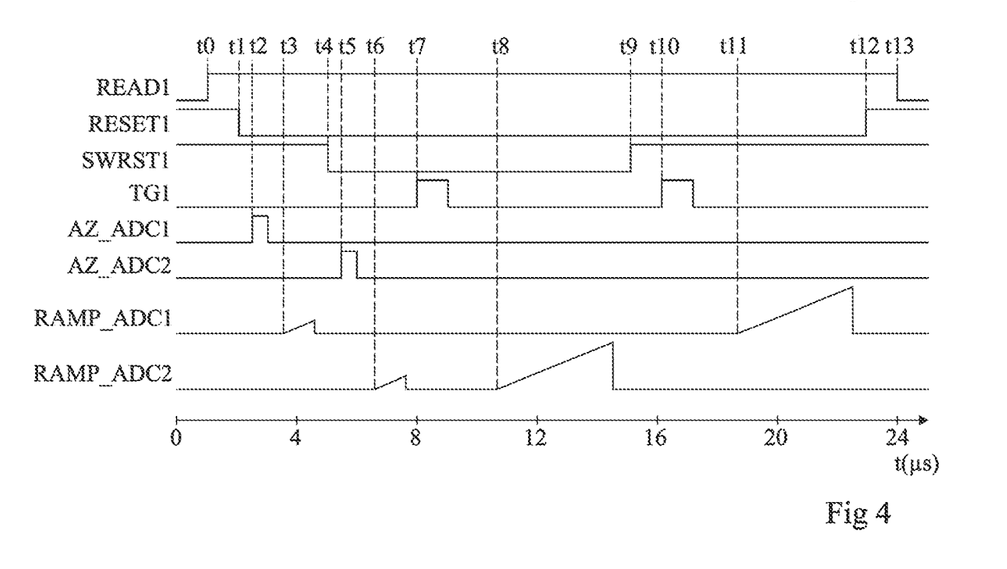
FIG. 4 is a timing diagram illustrating an example of signals in the circuit of FIGS. 1, 2 and 3 according to an example of the present disclosure.

FIG. 4 is a timing diagram illustrating examples of the signals READ1, RESET1, SWRST1, TG1, AZ_ADC1, AZ_ADC2, RAMP_ADC1 and RAMP_ADC2, during the reading of the pixel PIX1 of FIG. 3. It is assumed in this timing diagram that the multiplexers 110 are controlled to connect the column line VX1 to both of the ADCs 106, 108 of each column.

Initially, the signal SWRST1 is for example asserted, such that the further storage node STN1 is coupled to the sense node SN1. The reset signal RESET1 is also asserted, such that the further storage node STN1 is coupled to the reset voltage rail VRESET1.

At a time t0, the signal READ1 is asserted to start the read operation by coupling the pixel PIX1 to the column line VX1.

At a time t1, the signal RESET1 is brought low to isolate the further storage node SNT1 from the reset voltage rail VRESET1.

At a time t2, the signal AZ_ADC1 is asserted, resetting the voltage at the output of the amplifier 122 of the ADC 106 to the reference voltage VREF.

At a time t3, a ramp is applied to the ramp signal RAMP_ADC1, such that the reference level at the source node SN1 and further storage node STN1 is converted into a digital count value.

At a time t4, the signal SWRST1 is brought low, isolating the further storage node STN1 from the sense node SN1.

At a time t5, the signal AZ_ADC2 is asserted, resetting the output of the amplifier 122 of the ADC 108 to the reference voltage VREF.

At a time t6, a ramp is applied to the ramp signal RAMP_ADC2, such that the reference level at the source node SN1 is converted into a digital count value.

At a time t7, the signal TG1 is asserted in order to transfer the charge accumulated by the photodiode PPD1 to the sense node SN1.

At a time t8, a ramp is applied to the ramp signal RAMP_ADC2, such that the voltage level at the sense node SN1 is converted into a digital count value. This voltage level corresponds to the voltage resulting from charge captured during the integration period and transferred from the photodiode to the sense node, and will be referred to herein as the "captured voltage level."

At a time t9, the signal SWRST1 is asserted, coupling the further storage node STN1 to the sense node SN1.

At a time t10, the signal TG1 is asserted in order to perform a further transfer of the charge, accumulated by the photodiode PPD1 and that may not have been transferred completely at time t7, to the sense node SN1 and to the further storage node STN1.

At a time t11, a ramp is applied to the ramp signal RAMP_ADC1 such that the captured voltage level present at the sense node SN1 and further storage node STN1 is converted into a digital count value.

At a time t12, the reset signal RESET1 is applied, and then at the time t13, the signal READ1 is brought low, ending the read operation.

While not illustrated in FIG. 4, the pixel PIX2 can be read using a similar sequence to the one of FIG. 4, the signals READ1, RESET1, SWRST1 and TG1 being replaced by the signals READ2, RESET2, SWRST2 and TG2 respectively.

Thus, using the read circuit 104 of FIG. 1 having a pair of ADCs per column of the pixel array, it is possible to read two pixel values having two different conversion gains from each pixel of a row of pixels of the pixel array. It can be seen that each pixel value is generated based on nearly identical integration periods. In the example of FIG. 4, the integration periods for the low and high gain conversions start at the reset of the photodiode and end at t7 and t10 respectively, which could be further spaced in time.

Furthermore, each ADC 106, 108 is used to capture the reference level and captured voltage level of a same pixel value, meaning that a single auto-zero operation can be applied to each ADC prior to capturing the reference and captured voltage levels, leading to low noise. Once the high gain and low gain pixel values have been read from each pixel, an image can be formed by selecting, for each pixel, the high gain or low gain value, or a combination of the two, depending on the light levels present at each pixel.

The principles described above with reference to FIGS. 1 to 4 could be applied to other types of pixels, as will now be described in more detail. In particular, an example based on a flicker free pixel, providing three exposure times (long, medium and short), will now be described with reference to FIGS. 5, 6, 7 and 8.

Figure 5:
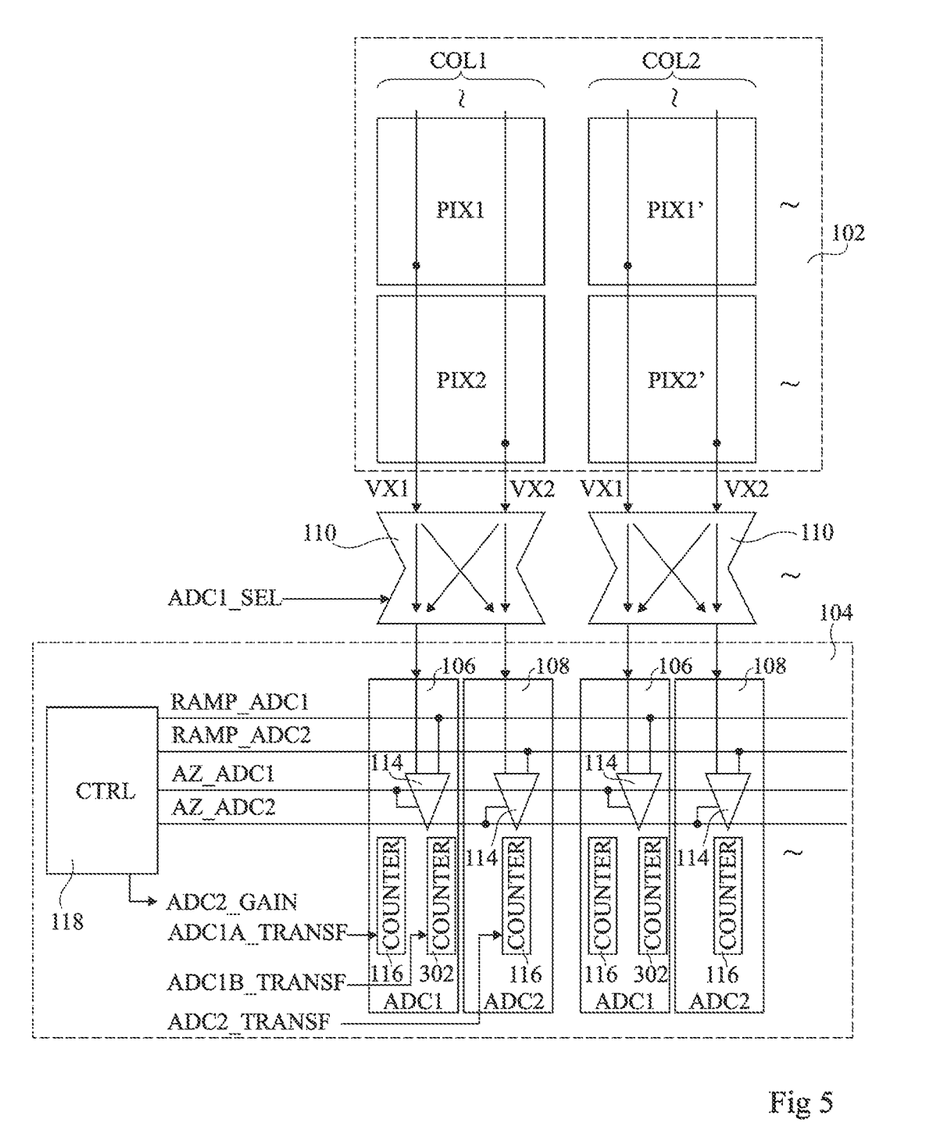
FIG. 5 illustrates part of a pixel array and of a readout circuit according to a further example embodiment of the present disclosure.

FIG. 5 schematically illustrates part of the pixel array 102 and of the readout circuit 104 according to a further example embodiment. The circuit of FIG. 5 is similar to that of FIG.

1, and like features have been labelled with like reference numerals and will not be described again in detail. In the example of FIG. 5, every second analog to digital converter comprises a pair of counters, the counter 116, and a further counter 302. Each counter 116, 302 of the ADCs 106 receives a corresponding control signal ADC1A_TRANSF and ADC1B-TRANSF from the circuit 118, controlling when its count value is output. Furthermore, the counter 116 of each ADC 108 receives a control signal ADC2_TRANSF, controlling when its count value is output. The ADCs 108 also for example receive a gain control signal ADC2_GAIN from the control circuit 118.

Figure 6:
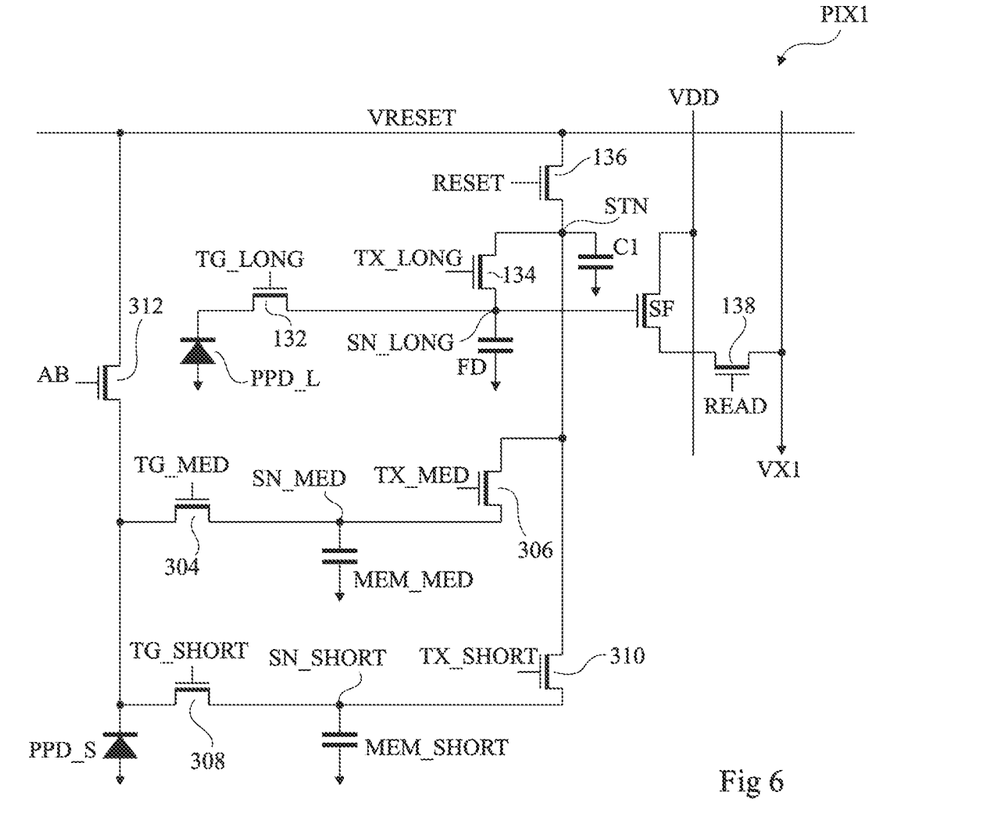
FIG. 6 illustrates a pixel of the pixel array of FIG. 5 in more detail according to an example embodiment.

FIG. 6 schematically illustrates the pixel PIX1 of FIG. 5 in more detail according to example embodiment. The other pixels of the pixel array 102 of FIG. 5 are for example implemented by the same or similar circuits. In the example of FIG. 6, the pixel comprises two photodiodes PPD_L and PPD_S, and the photodiode PPD_L for example has larger dimensions than the photodiode PPD_S, in other words it accumulates charge at a faster rate for a given luminance received by the pixel.

The photodiode PPD_L is coupled via the transfer gate 132, the source follower transistor SF, and the readout transistor 138 to the output column line VX1 in a similar manner to the photodiode PPD1 of FIG. 3. The sense node SN1 is labelled SN_LONG in FIG. 6, and is coupled to a further sense node STN via the transistor 134. The further sense node STN is also coupled to a reset level VRESET via the transistor 136. The transistors 132, 134, 136 and 138 in FIG. 6 are respectively controlled by signals TG_LONG, TX_LONG, RESET and READ.

The photodiode PPD_S is coupled to the further sense node STN via two paths. One path comprises a transfer gate 304 coupling the cathode of the photodiode PPD_S to a further sense node SN_MED, which is in turn coupled to ground via a capacitance MEM_MED that for example stores medium integration time information. The sense node SN_MED is also coupled to the storage node STN via a transistor 306. The other path comprises a transfer gate 308 coupling the cathode of the photodiode PPD_S to a further sense node SN_SHORT, which is in turn coupled to ground via a capacitor MEM_SHORT that for example stores short integration time information. The sense node SN_SHORT is also coupled to the storage node STN via a transistor 310. The cathode of the photodiode PPD_S is further coupled by a transistor 312 to the reset voltage rail VRESET, the transistors 304, 306, 308, 310 and 312 being respectively controlled by signals TG_MED, TX_MED, TG_SHORT, TX_SHORT and AB.

In operation, the pixel of FIG. 6 is capable of providing a capturing operation of high sensitivity and long exposure using the photodiode PPD_L, and generating the readout using one of two conversion gains using only the sense node SN_LONG (high gain), or using the sense node SN_LONG and the further storage node STN (low gain). Furthermore, using the photodiode PPD_S, exposures of medium or short duration can be captured, with charge stored to the capacitors MEM_MED and MEM_SHORT, which can be read out using the same source follower transistor SF as the photodiode PPD_L. Anti-blooming is for example performed on the photodiode PPD_S during the integration period by means of transistor 312. Anti-blooming is for example performed on the photodiode PPD_L by means of the transistors 132, 134 and 136, by keeping the signals RESET and TX_LONG asserted during the entire integration period. Furthermore, anti-flicker can be achieved by chopping the operation of the transfer gates 304 and 308 as will now be described with reference to FIG. 7.

Figure 7:
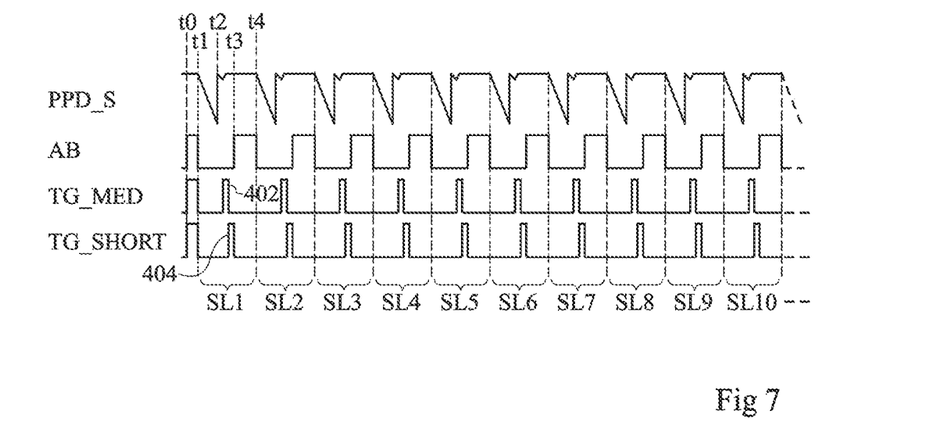
FIG. 7 is a timing diagram illustrating an example of signals in the pixel of FIG. 6 during an integration phase according to an example embodiment.

FIG. 7 is a timing diagram illustrating the signals across the photodiode PPD_S during a signal integration phase, the signal AB, and the signals TG_MED and TG_SHORT in the circuit of FIG. 6 according to an example embodiment.

At a time t0, the signals AB, TG_MED and TG_SHORT are for example asserted in order to reset the photodiode PPD_S and the voltages at the sense nodes SN_MED and SN_SHORT.

At a time t1, the reset operation ends, and an integration period of the photodiode PPD_S starts, which is divided into a plurality of slices SL1 to SLn, of which slices SL1 to SL10 are illustrated in FIG. 7. In some embodiments, n is equal to at least 10, and for example several hundred, and the slices are evenly spread over a period of around 10 µs.

Each slice SL1 to SLn includes a first portion of the integration period, followed by separate charge transfer periods for respectively transferring charge to the capacitors MEM_MED and MEM_SHORT. A reset of the photodiode PPD_S is then performed, without resetting the voltages at the nodes SN_MED and SN_SHORT.

For example, the slice SL1 comprises, at a time t2, a charge transfer to the capacitor MEM_MED implemented by a pulse 402 of the signal TG_MED, followed by a charge transfer to the capacitor MEM_SHORT implemented by a pulse 404 of the signal TG_SHORT. The photodiode PPD_S is then reset at a time t3 by the activation of the signal AB.

At a time t4, the reset operation ends, starting the slice SL2.

By dividing the integration period into slices as represented in FIG. 7, flicker in the image scene can be reduced. Indeed, where the image scene comprises one or more light sources operating at certain frequencies, typically around 100 to 1000 Hz, the image quality may be impacted based on the timing of the integration period with respect to the phase of the light source. By dividing the integration period into slices as represented in FIG. 7, the flicker can be reduced by averaging the effect of the light sources over several portions of the integration period.

A reading operation using the circuits of FIGS. 5 and 6 will now be described in more detail with reference to FIG. 8.

Figure 8:
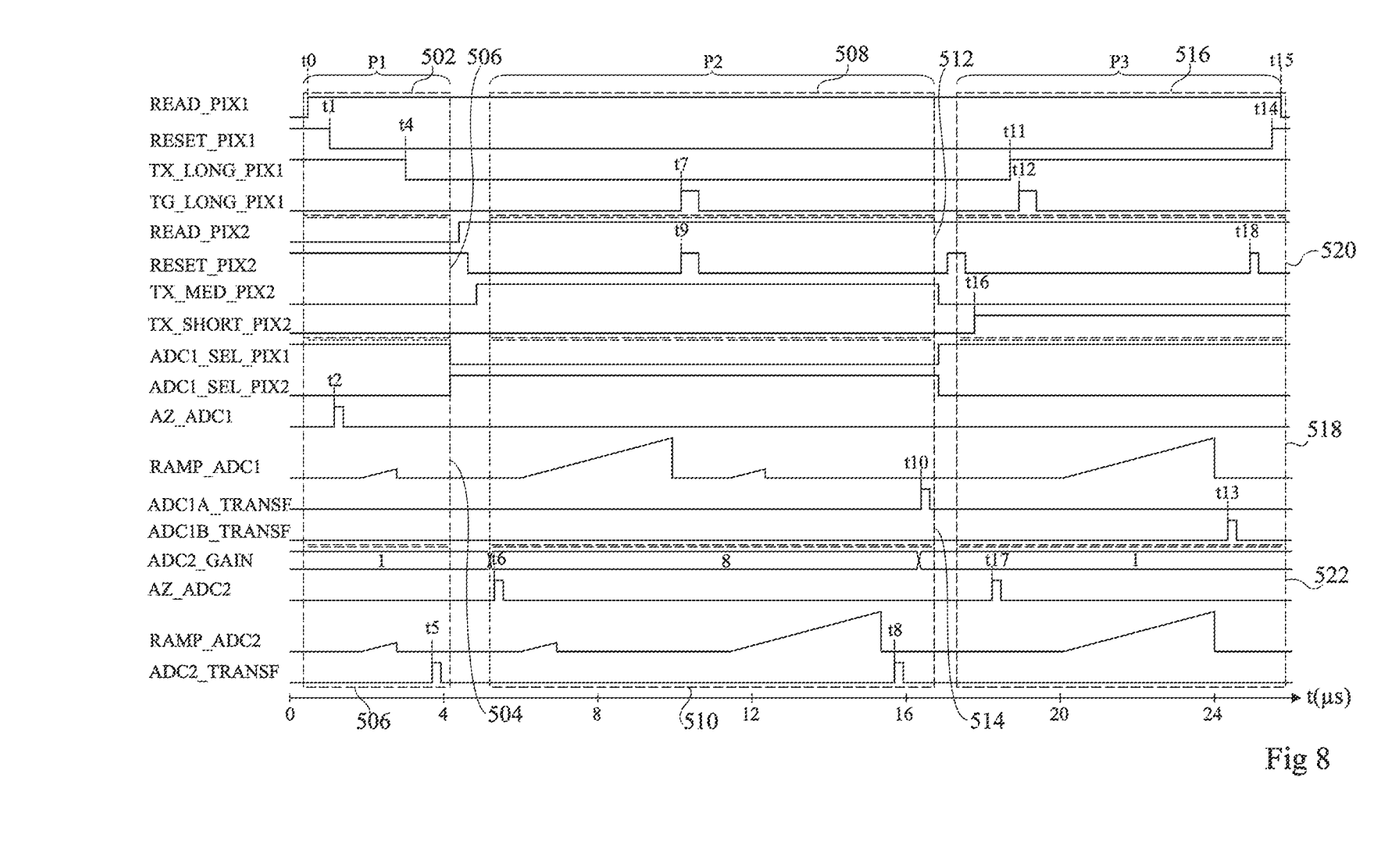
FIG. 8 is a timing diagram illustrating an example of signals in the circuit of FIGS. 5 and 6 during a readout phase according to an example embodiment.

FIG. 8 is a timing diagram illustrating examples of:
the signals READ_PIX1, RESET_PIX1, TX_LONG_PIX1 and TG_LONG_PIX1 applied to the pixel PIX1 of FIG. 5, from which are read out, in this example, the captured pixel values using the photodiode PPD_L;
the signals READ_PIX2, RESET_PIX2, TX_MED_PIX2 and TX_SHORT_PIX2 applied to the pixel PIX2 of FIG. 5, from which are read out, in this example, the captured pixel values using the photodiode PPD_S;
the signals ADC1_SEL_PIX1, ADC1_SEL_PIX2, AZ_ADC1, RAMP_ADC1, ADC1A_TRANSF and ADC1B_TRANSF for controlling the ADC 106 of the column COL1 of FIG. 5; and
the signals ADC2_GAIN, AZ_ADC2, RAMP_ADC2 and ADC2_TRANSF for controlling the ADC 108 of the column COL1 of FIG. 5.

In the example of FIG. 8, the readout of the two pixels PIX1 and PIX2 is performed over three successive periods P1, P2 and P3.

During the period P1, an operation 502 is performed in which a reference level at the sense node SN_LONG is output by the pixel PIX1 on the column line VX1, and an operation 504 is performed in which the reference level is converted into a digital value by the ADC 106. The reference level is converted in the low gain conversion mode while the transistor 134 is activated such that the further storage node STN is coupled to the sense node SN_LONG. Thus the signals RESET and TX_LONG are initially high for the pixel PIX1, and the signal ADC1_SEL_PIX1 is for example high and the signal ADC1_SEL_PIX2 is low, such that the column line VX1 is coupled to the ADC 106. The signal TG_LONG remains low during the period P1. The signal READ goes high at a time t0 in order to output the voltage at the sense node SN_LONG on the column line VX1. The signal RESET_PIX1 goes low at a time t1, ending the sense node reset. The auto-zero signal AZ_ADC1 for example goes high at a time t2, resetting the voltage at the output of the comparator 114 of the ADC 106. The ramp signal RAMP_ADC1 is then applied in order to detect the reference level at the sense node SN_LONG of the pixel PIX1. The count value is for example stored by the counter 116. At a time t4 the signal TX_LONG_PIX1 for example goes low, decoupling the further storage node STN from the sense node SN_LONG.

Also during the period P1, an operation 506 is for example performed involving reading a reference value from the sense node SN_SHORT of another pixel of the column COL1 other than the pixels PIX1 and PIX2. This for example involves applying a ramp to the ramp signal RAMP_ADC2 and then asserting, at a time t5, the signal ADC2_TRANSF in order to output the value from the counter 116 of the ADC 108, and this counter is for example reset.

During the period P2, operations 508 and 510 are for example performed involving a high conversion gain reading of the reference level and captured voltage level from the sense node SN_LONG of the pixel PIX1. This involves applying the auto-zero signal AZ_ADC2 at a time t6, and applying a high ADC gain by for example setting the signal ADC2_GAIN to a value of 8. This high ADC gain ensures even higher sensitivity and reduces the input referred read noise, for example to a minimum. A ramp is then applied to the ramp signal RAMP_ADC2 to convert the reference level. At a time t7, the signal TG_LONG_PIX1 is then asserted to transfer the signal from the photodiode PPD_L to the sense node SN_LONG, and a ramp is applied to the ramp signal RAMP_ADC2 to convert the captured voltage level using the high conversion gain. At a time t8, the signal ADC2_TRANSF is asserted in order to output the count value held by the counter 116 of the ADC 108, and this counter is for example reset.

Also during the period P2, operations 512 and 514 are performed involving reading a captured voltage level and reference level at the node SN_MED of the pixel PIX2. The signal READ_PIXEL2 is for example asserted, the signal RESET_PIX2 is for example brought low, and the signal TX_MED_PIX2 is for example asserted, between the periods P1 and P2. The signal TX_LONG_PIX2 is also asserted to couple the sense node SN_LONG to the further storage node STN. A ramp is applied to the ramp signal RAMP_ADC1 to convert the captured voltage level at the node SN_LONG of the pixel PIX2, and the counter 302 of the ADC 106 is used to perform the conversion. At a time t9, the signal RESET_PIX2 is for example asserted in order to reset the voltage at the sense node SN_LONG and a ramp is applied to the ramp signal RAMP_ADC1 to convert the reference level of the node SN_MED of the pixel PIX2. At a time t10, the signal ADC1A_TRANSF is asserted in order to output the count value from the counter 302, and this counter is for example reset.

During the period P3, operations 516 and 518 involve reading the signal from the photodiode PPD_L using the ADC 106. Between the periods P2 and P3, the signals ADC1_SEL_PIX1 and ADC1_SEL_PIX2 are inverted in order to couple the column line VX1 to the ADC 106. At a time t11, the signal TX_LONG_PIX1 is asserted, and then at a time t12, the signal TG_LONG_PIX1 is asserted in order to transfer the remaining charge, accumulated by the photodiode PPD_L and not transferred at time t7, to the sense node SN_LONG of the pixel PIX1. A ramp is then applied to the signal RAMP_ADC1 in order to read and convert, using the counter 116 of the ADC 106, the captured voltage level. At a time t13, the signal ADC1B_TRANSF is asserted in order to output the count value from the counter 116 of the ADC 106, and this counter is for example reset. The reset signal RESET_PIX1 for example goes high at a time t14, and the read signal READ_PIX1 goes low at a time t15 to end the read phase of the pixel PIX1.

Also during the period P3, operations 520 and 522 are performed involving reading the signal transferred to the node SN_SHORT of the pixel PIX2. Between the periods P2 and P3, the signal TX_MED_PIX2 is for example brought low and the signal RESET_PIXEL2 is for example asserted in order to reset the voltage at the sense node SN_LONG. At a time t16, the signal TX_SHORT_PIX2 is asserted in order to couple the sense node SN_SHORT to the further storage node STN in the pixel PIX2, while the signal TX_LONG_PIX2 is still asserted to couple the sense node SN_LONG to the further storage node STN. Then, at a time t17, the auto-zero signal AZ_ADC2 is asserted to reset the voltage at the output of the comparator 114 of the ADC 108, and a ramp is applied to the ramp signal RAMP_ADC2 in order to convert the signal at the sense node SN_LONG of the pixel PIX2. The reset signal RESET_PIX2 is then for example applied at a time t18, and the reference level at the sense node SN_LONG is read for the pixel PIX2 during a subsequent operation (not illustrated in FIG. 8) similar to the operation 506 described above.

Thus the read sequence of FIG. 8 permits four difference pixel values to be read from two pixels: a pixel value captured by the photodiode PPD_L of one pixel using a relatively long exposure time and using low and high conversion gains; and a pixel value captured by the photodiode PPD_S of the other pixel using the medium integration time capacitance MEM_MED and using the small integration time capacitance MEM_SHORT. The use of three counters at the bottom of each pair of columns permits a same ADC to be used to capture the reference and captured voltage levels of each pixel value.

Rather than the pixels of the pixel array 102 of FIG. 5 being implemented by the pixel of FIG. 6, they could be implemented by the pixels of FIG. 3, as will now be described with reference to FIG. 9.

Figure 9:
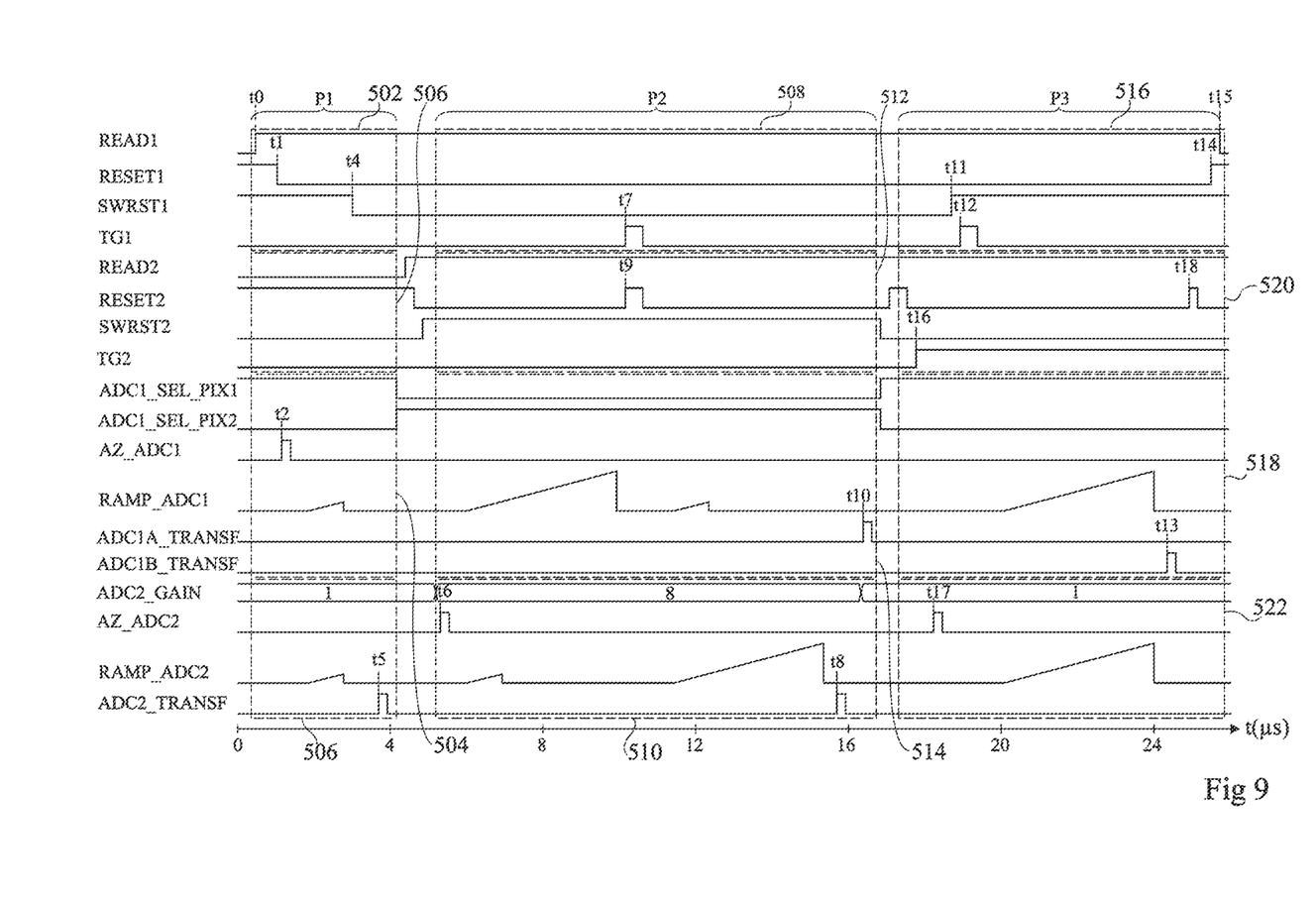
FIG. 9 is a timing diagram illustrating an example of signals in the circuit of FIG. 3 according to an example embodiment.

FIG. 9 is a timing diagram illustrating an example of the timing signals in the circuit of FIG. 5 for the case that the pixels are implemented by those of FIG. 3. The timing sequences are very similar to those of FIG. 8, and will not be described again in detail. However, in the case of FIG. 9, the signals READ_PIX1, RESET_PIX1, TX_LONG_PIX1, TG_LONG_PIX1, READ_PIX2, RESET_PIX2, TX_MED_PIX2 and TX_SHORT_PIX2 are respectively relabeled READ1, RESET1, SWRST1, TG1, READ2, RESET2, SWRST2 and TG2, to correspond to the signals in the pixels of FIG. 3. This timing sequence for example permits each of the pixels PIX1 and PIX2 to be read with a low and high conversion gain. In some embodiments, the pixel PIX2 has a shorter exposure time than the pixel PIX1 used in high light conditions, in view of the lack of an auto-zero applied prior to reading the pixel value from the pixel PIX2.

The pixels of the pixel array 102 of FIG. 5 could alternatively be implemented by other types of pixels, an example of which will now be described with reference to FIG. 10.

Figure 10:
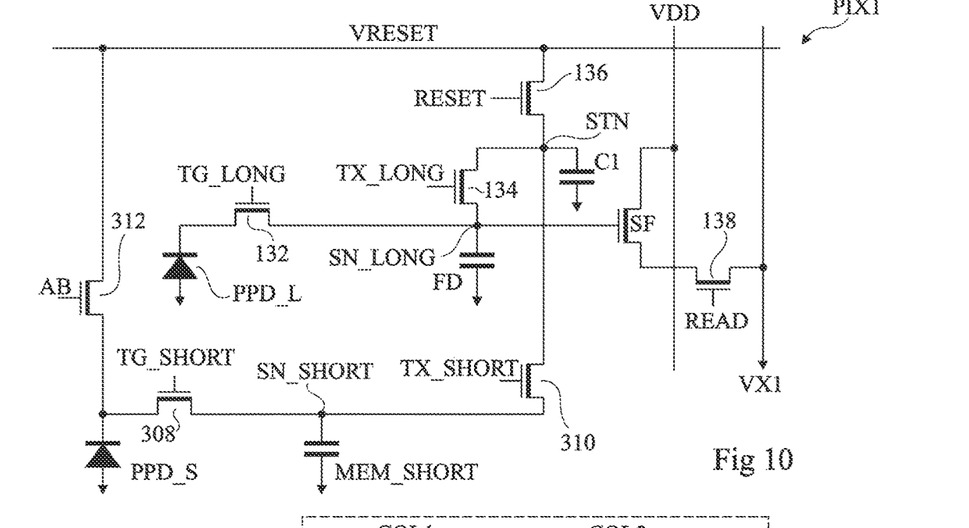
FIG. 10 illustrates a pixel of the pixel array of FIG. 5 in more detail according to a further example embodiment.

FIG. 10 schematically illustrates the pixel PIX1 according to a further example embodiment. The other pixels of the pixel array 102 of FIG. 5 are for example implemented by the same or similar circuits. The circuit of FIG. 10 is similar to the circuit of FIG. 6, and like features have been labelled with like reference numerals and will not be described again in detail. With respect to the pixel of FIG. 6, the pixel of FIG. 10 omits the transistors 304 and 306, and the capacitor MEM_MED.

In operation, a similar read sequence to the one described in relation with FIG. 8 can be used for the pixel of FIG. 10, but the simplification of the pixel means that one of the ADCs of FIG. 5 will not be occupied some of the time.

Figure 11:
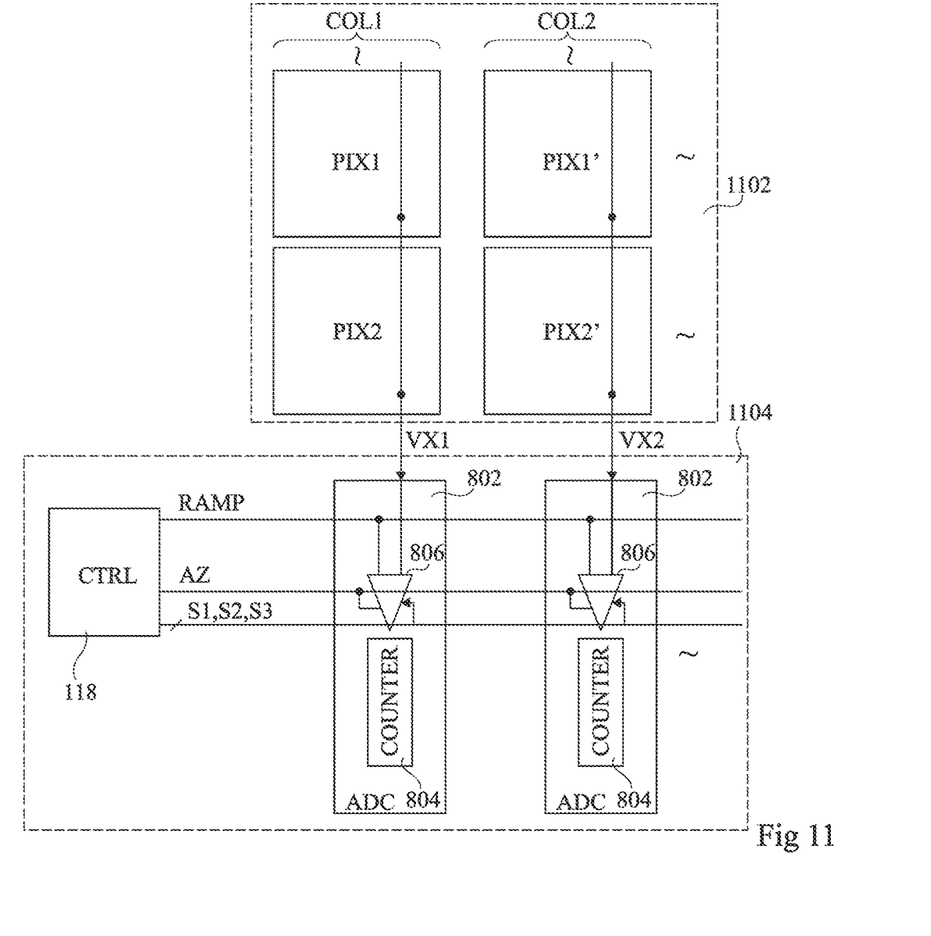
FIG. 11 illustrates part of a pixel array and of a readout circuit according to yet a further example embodiment of the present disclosure.

FIG. 11 schematically illustrates part of a pixel array 1102 and of the readout circuit 1104 according to a further example embodiment. Some elements of the circuits of FIG. 11 are similar to that of FIG. 1, and like features have been labelled with like reference numerals and will not be described again in detail. In the example of FIG. 11, the multiplexers 110 (FIG. 1) are omitted, and the ADCs 106 and 108 of each column are replaced by a single ADC 802 having a single counter (COUNTER) 804. A comparator 806 of each ADC 802 receives signals RAMP and AZ, and also switch control signals S1, S2 and S3, generated by the control circuit (CTRL) 118.

Each of the pixels in the pixel array 1102 of FIG. 11 is for example implemented by a circuit similar to that of FIG. 3.

Figure 12:
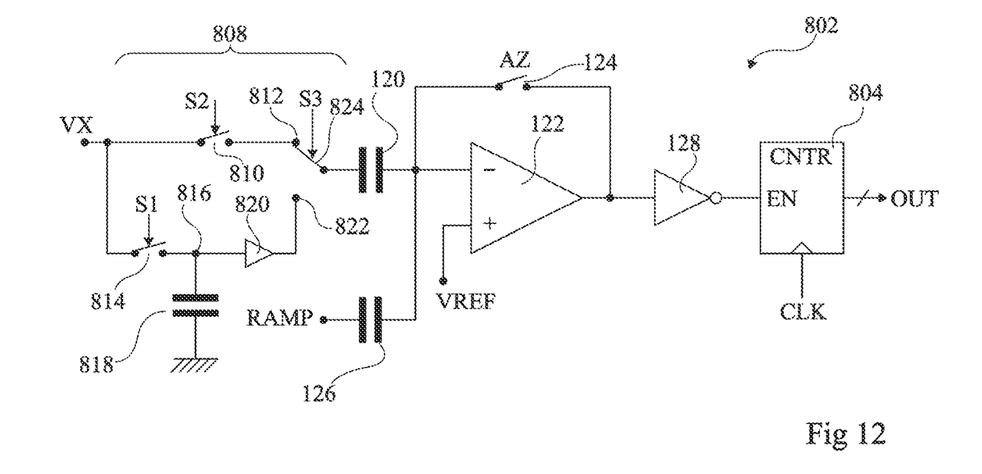
FIG. 12 illustrates an analog to digital converter of FIG. 11 in more detail according to an example embodiment.

FIG. 12 schematically illustrates the ADC 802 of FIG. 11 in more detail according to an example embodiment. Certain features of the ADC 802 are the same as those of the ADC 106 of FIG. 2, and these features have been labelled with like reference numerals in FIG. 12 and will not be described again in detail. The counter 116 is replaced in FIG. 12 by a counter (CNTR) 804. The ADC 802 additionally comprises an input circuit 808 coupling the column line VX to the input capacitor 120.

The input circuit 808 for example comprises a switch 810 coupling the column line VX to a node 812, a switch 814 coupling the column line VX to a node 816, a capacitor 818 coupled between the node 816 and ground, and a buffer 820 coupling the node 816 to a further node 822. A two-way switch 824 permits either of the nodes 812 and 822 to be coupled to the input capacitor 120 of the ADC.

Operation of the circuit of FIG. 11 and of the ADC 802 of FIG. 12 will now be described in more detail with reference to FIG. 13.

Figure 13:
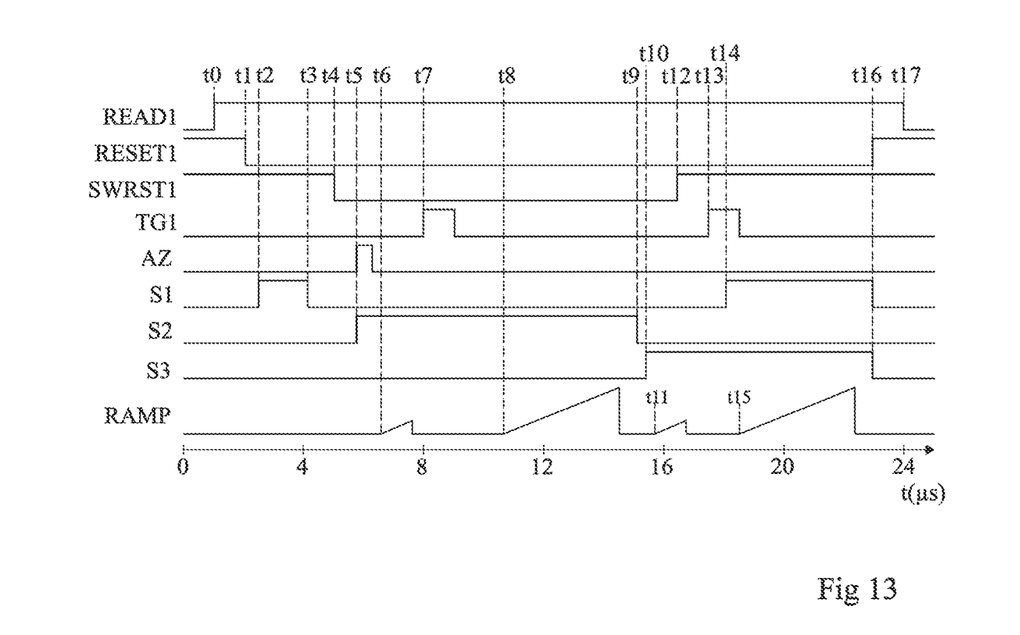
FIG. 13 is a timing diagram illustrating an example of signals in the circuit of FIGS. 11 and 12 according to an example embodiment.

FIG. 13 is a timing diagram illustrating examples of the signals READ1, RESET1, SWRST1, TG1, AZ, S1, S2, S3 and RAMP of FIGS. 11 and 12.

Initially, the signal SWRST1 is for example asserted, such that the further storage node STN1 is coupled to the sense node SN1. The reset signal RESET1 is also asserted, such that the further storage node STN1 is coupled to the reset voltage rail VRESET1.

At a time t0, the signal READ1 is asserted to start the read operation by coupling the pixel PIX1 to the column line VX1.

At a time t1, the signal RESET1 is brought low to isolate the further storage node STN1 from the reset voltage rail VRESET1.

At a time t2, the control signal S1 for example goes high, causing the column line VX to be coupled to the node 816 of the ADC 802. The reference level at the sense node SN1 and further storage node STN1 of the pixel PIX1 is thus sampled to the capacitor 818.

At a time t3, the signal S1 for example goes low such that capacitor 818 holds the sampled signal until it is used at a later time.

At a time t4, the signal SWRST1 is brought low, isolating the further storage node STN1 from the sense node SN1.

At a time t5, the signals AZ and S2 are for example asserted, causing the column line VX to be coupled to the input capacitor 120 via the switches 810 and 824, and causing the output voltage of the amplifier 122 to be reset to the reference voltage VREF.

At a time t6, a ramp is applied to the ramp signal RAMP, such that the reference level at the source node SN1 is converted into a digital count value.

At a time t7, the signal TG1 is asserted in order to transfer the charge accumulated by the photodiode PPD1 to the sense node SN1.

At a time t8, a ramp is applied to the ramp signal RAMP, such that the captured voltage level at the sense node SN1 is converted into a digital count value. This count value is then output from the counter 804, and the counter is for example reset.

At a time t9, the signal S2 is brought low, and at a time t10, the signal S3 is asserted in order to couple the node 816 to the input capacitor 120 via the buffer 820 and the switch S3.

At a time t11, a ramp is applied to the ramp signal RAMP, such that the reference level previously stored by the capacitor 818 is converted into a digital count value.

At a time t12, the signal SWRST1 is asserted, coupling the further storage node STN1 to the sense node SN1.

At a time t13, the signal TG1 is asserted in order to perform a further transfer of the charge, accumulated by the photodiode PPD1 and not transferred at the time t7, to the sense node SN1 and to the further storage node STN1.

At a time t14, the signal S1 is asserted in order to couple the column line VX to the input capacitor 120 via the switch S1, the buffer 820 and the switch S3.

At a time t15, a ramp is applied to the ramp signal RAMP such that the captured voltage level present at the sense node SN1 and further storage node STN1 is converted into a digital count value.

At a time t16, the signals S1 and S3 return low, and the reset signal RESET1 is applied, and then at the time t17, the signal READ1 is brought low, ending the read operation.

While not illustrated in FIG. 13, the pixel PIX2 can be read using a similar sequence to the one of FIG. 13, the signals READ1, RESET1, SWRST1 and TG1 being replaced by the signals READ2, RESET2, SWRST2 and TG2 respectively.

Thus, using the single ADC 802, it is possible to read two pixel values having two different conversion gains from each pixel of a row of pixels of the pixel array. Furthermore, a same capacitor of the ADC 802 is used to capture the reference level and captured voltage level of a same pixel value, meaning that a single auto-zero operation can be applied to each ADC prior to capturing the reference and captured voltage levels. Once the high gain and low gain pixel values have been read from each pixel, an image can be formed by selecting, for each pixel, the high gain or low gain value, or a combination of the two, depending on the light levels present at each pixel, as will now be described with reference to FIG. 14.

Figure 14:
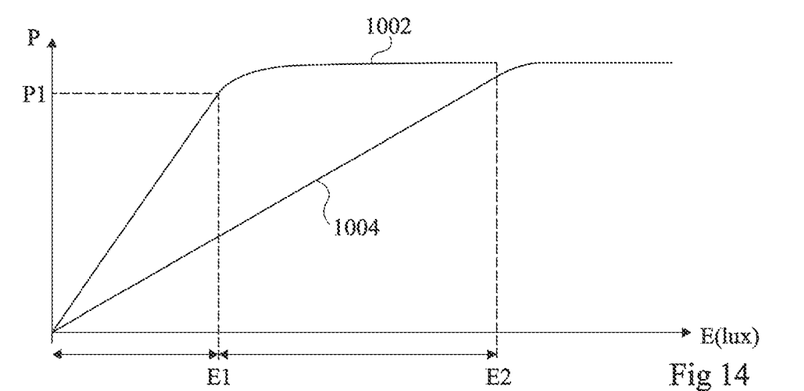
FIG. 14 is a graph representing readout signals of a pixel of a pixel array as a function of luminosity.

FIG. 14 is a graph illustrating the pixel value P as a function of the luminance E, in lux, received by the pixel from the image scene. The pixel value P for example corresponds to the difference between the reference voltage level and captured voltage level detected by the ADCs 106/108 of FIGS. 1 and 5 or 802 of FIG. 11.

A curve 1002 in FIG. 14 represents the output signal at high conversion gain. It can be seen that the capacitance of the high conversion gain becomes saturated soon after the luminance reaches a threshold E1. A curve 1004 represents the output signal at a low conversion gain. The higher capacitance of the low conversion gain saturates only after the luminance exceeds a threshold E2, which is higher than the threshold E1. The conversion gain to be used for each pixel value is for example selected, pixel by pixel. For example, the high conversion gain is used when the resulting pixel value is less than a threshold P1 corresponding to the luminance of E1, and the low conversion gain is used otherwise.

An advantage of the readout circuits described herein is that they permit a relatively high SNR to be achieved over a broad range of light levels, as will now be described with reference to FIGS. 15 and 16.

Figure 15:
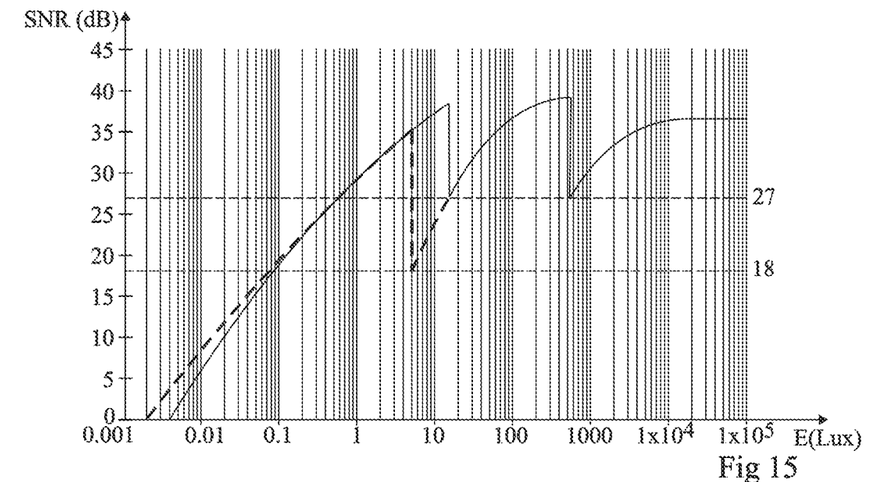
FIG. 15 is a graph illustrating an example of the SNR as a function of luminosity for a standard readout circuit.

FIG. 15 is a graph showing the SNR as a function of the luminance E in lux (log scale) for a low conversion gain (solid curve) and a high conversion gain (dashed curve), based on a pixel having three exposure times, such as the pixel of FIG. 6, but using a standard readout circuit generating an image entirely using a low conversion gain or entirely using a high conversion gain. It can be seen that the SNR is relatively low when the low conversion gain is used for the pixels at low light levels, and it is also relatively low when the high conversion gain is used.

Figure 16:
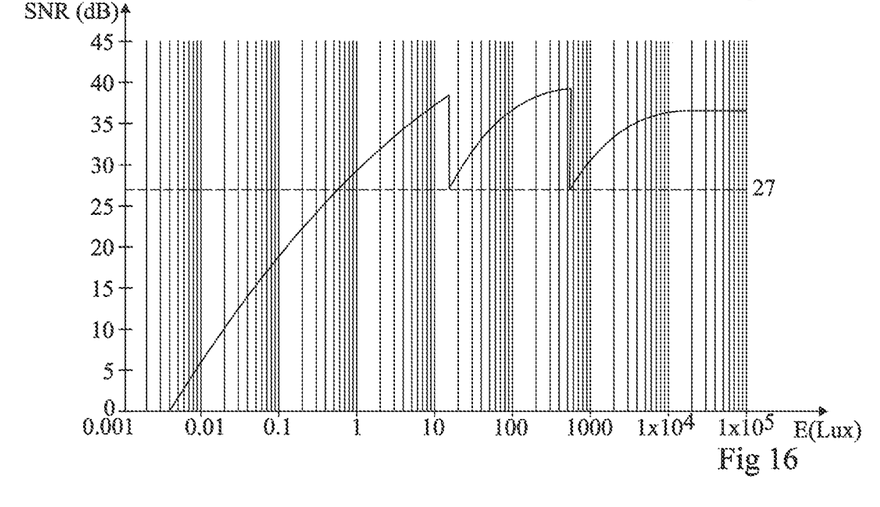
FIG. 16 is a graph illustrating a further example of the SNR as a function of luminosity for the readout circuit of the present disclosure.

FIG. 16 is a graph similar to that of FIG. 15, but illustrating the SNR when the readout circuit of the present disclosure is used. It can be seen that the SNR corresponds to the best case of FIG. 15 for each luminance level, as it becomes possible to select the conversion gain pixel by pixel.

Having thus described at least one illustrative embodiment, various alterations, modifications and improvements will readily occur to those skilled in the art. For example, while several pixel architectures have been described permitting different conversion gains, it will be apparent to those skilled in the art that the principles described herein could be applied to other types of pixel architects that permit a plurality of conversion gains to be applied.

Furthermore, it will be apparent to those skilled in the art that the various features described in relation with the various embodiments could be combined, in alternative embodiments, in any combination. For example, the ADC 802 of FIG. 12 could be used in the readout circuit of FIG. 6.

Described embodiments of the subject matter can include one or more features, alone or in combination. For example, in an embodiment, a readout circuit of a pixel array includes: a first capacitor coupled to a first column line of the pixel array via a first switch and configured to store a first reference voltage level of a first pixel based on a first conversion gain of the first pixel. The readout circuit also includes a second capacitor coupled to the first column line of the pixel array via a second switch and configured to store a second reference voltage level of the first pixel based on a second conversion gain of the first pixel. The first and second conversion gains are different from each other.

The foregoing and other described embodiments can each, optionally, include one or more of the following features:

A first feature, combinable with any of other features described herein, specifies that the first and second capacitors (818, 120) are coupled together by a third switch (824).

A second feature, combinable with any of other features described herein, specifies that the first and second capacitors (818, 120) are coupled together by a third switch (824) and a buffer (820).

A third feature, combinable with any of other features described herein, specifies that the third switch (824) is configured to couple the second capacitor (120) to the first column line (VX) during a first phase and to couple the second capacitor (120) to the first capacitor (818) and the buffer (820) during a second phase.

A fourth feature, combinable with any of other features described herein, specifies that the analog to digital converter is a ramp converter that includes a differential amplifier (122) having a first input coupled to the second capacitor (120) and to a third capacitor (126) receiving a ramp signal (RAMP) and a second input coupled to a reference voltage (VREF).

A fifth feature, combinable with any of other features described herein, specifies that the differential amplifier (122) further includes an output coupled to the first input via a further switch (124).

A sixth feature, combinable with any of other features described herein, specifies the readout circuit further includes a control circuit (118) configured to provide the ramp signal (RAMP) to the third capacitor (126) and an auto-zero signal (AZ) to the further switch (124).

In another embodiment, an image sensor includes a pixel array (102) comprising said first pixel and the readout circuit.

A seventh feature, combinable with any of other features described herein, specifies that the first pixel is configured to transfer accumulated charge to a first node (SN1) having a first capacitance in order to provide said first conversion gain and to transfer accumulated charge to a second node (STN) or to both the first and second nodes (SN1, STN1) in order to provide said second conversion gain.

In another embodiment, a method of reading a pixel array using a readout circuit includes controlling a first switch (814) of an analog to digital converter (802) of the readout circuit to couple a first capacitor (818) to a first column line (VX) of the pixel array to store a reference voltage level of a first pixel (PIX1) based on a first conversion gain of the first pixel; and controlling a second switch (810) of the analog to digital converter (802) to couple a second capacitor (120) to the first column line (VX) of the pixel array to store a reference voltage level of the first pixel (PIX1) based on a second conversion gain of the first pixel, the first and second conversion gains being different from each other.

A eighth feature, combinable with any of other features described herein, specifies that the method further includes controlling the analog to digital converter (802) to convert, into a first digital value, the reference voltage level of the first pixel (PIX1) based on the second conversion gain; controlling the analog to digital converter (802) to convert, into a second digital value, the captured voltage level of the first pixel (PIX1) based on the second conversion gain; controlling the analog to digital converter (802) to convert, into a third digital value, the reference voltage level of the first pixel (PIX1) based on the first conversion gain; controlling the first switch (814) to couple the first capacitor (818) to the first column line (VX); and controlling the analog to digital converter (802) to convert, into a fourth digital value, the captured voltage level of the first pixel (PIX1) based on the first conversion gain.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
a first analog to digital converter coupled to a first column line of a pixel array and configured to convert a reference voltage level and a captured voltage level of a first pixel of the first column line based on a first conversion gain of the first pixel; and
a second analog to digital converter coupled to the first column line of the pixel array and configured to convert both the reference voltage level and the captured voltage level of the first pixel based on a second conversion gain of the first pixel and between, in time sequence, the converting the reference voltage level of the first pixel based on the first conversion gain and the converting the captured voltage level of the first pixel based on the first conversion gain by the first analog to digital converter, the first and second conversion gains being different from each other.

2. The circuit of claim 1, further comprising a multiplexer, wherein the first analog to digital converter is coupled to the first pixel via the multiplexer and a first column line, and the second analog to digital converter is coupled to the first pixel via the multiplexer and the first column line.

3. The circuit of claim 1, wherein the first and second analog to digital converters are ramp converters, the circuit further comprising a control circuit configured to provide a first ramp signal to the first analog to digital converter and a second ramp signal to the second analog to digital converter.

4. The circuit of claim 3, wherein the control circuit is further configured to provide a first auto-zero signal to the first analog to digital converter, and a second auto-zero signal to the second analog to digital converter.

5. The circuit of claim 1, wherein at least one of the first and second analog to digital converters includes a first counter and a second counter.

6. The circuit of claim 1, further comprising the pixel array having said first pixel.

7. The circuit of claim 6, wherein the first pixel is configured to transfer accumulated charge to a first node having a first capacitance in order to provide the first conversion gain and to transfer accumulated charge to a second node or to both the first and the second nodes in order to provide the second conversion gain.

8. The circuit of claim 6, wherein the first pixel includes a first sense node coupled to a first photodiode via a first transfer gate and a further storage node coupled to the first sense node by a first transistor.

9. The circuit of claim 8, wherein the first pixel is capable of generating a first captured voltage level resulting from a first exposure time of the first photodiode and of generating a second captured voltage level resulting from a second exposure time of the first photodiode.

10. The circuit of claim 9, wherein the first pixel includes a second sense node coupled to the first photodiode via a second transfer gate, wherein the first and second transfer gates are controlled by pulsed signals to transfer the charge from the first photodiode over a plurality of transfer periods.

11. The circuit of claim 8, wherein the first pixel further includes a second photodiode of different dimensions from the first photodiode.

12. A method of reading a pixel array comprising:
converting, by a first analog to digital converter coupled to a first column line of the pixel array, a first reference voltage level and a first captured voltage level of a first pixel based on a first conversion gain of the first pixel; and
converting, by a second analog to digital converter coupled to the first column line of the pixel array, the first reference voltage level and the first captured voltage level of the first pixel based on a second conversion gain of the first pixel, the first and second conversion gains being different from each other,
wherein the converting by the first analog to digital converter and the converting by the second analog to digital converter are conducted in a sequence of:
converting the first reference voltage level of the first pixel based on the first conversion gain;
converting the first reference voltage level of the first pixel based on the second conversion gain;
converting the first captured voltage level of the first pixel based on the second conversion gain; and
converting the first captured voltage level of the first pixel based on the first conversion gain.

13. The method of claim 12, wherein the first and second analog to digital converters are ramp converters, the method further comprising providing, by a control circuit, a first ramp signal to the first analog to digital converter and a second ramp signal to the second analog to digital converter.

14. The method of claim 12, further comprising, while the first analog to digital converter performs the converting of the first reference voltage level and the first captured voltage level of the first pixel received via a first column line, converting, by the second analog to digital converter based on the second conversion gain, a second reference voltage level and a second captured voltage level of a second pixel received via a second column line of the pixel array.

15. The method of claim 14, wherein the first and second pixels each includes a first storage node having a first capacitance and a second storage node having a second capacitance, wherein the first reference voltage level and the first captured voltage level of the first pixel are read from the first storage node of the first pixel, and the second reference voltage level and the second captured voltage level of the second pixel are read from the second storage node of the second pixel.

16. The method of claim 15, wherein the first and second pixels each further includes a third storage node having a third capacitance, the method further comprising, while the second analog to digital converter performs the converting the first reference voltage level and the first captured voltage level of the first pixel received via the first column line, converting, by the first analog to digital converter based on the first conversion gain, the second reference voltage level and the second captured voltage level of the second pixel received via the second column line and read from the third storage node of the second pixel.

17. A readout circuit of a pixel array having an analog to digital converter comprising:
- a first capacitor coupled to a first column line of the pixel array via a first switch and configured to store a first reference voltage level of a first pixel based on a first conversion gain of the first pixel;
- a second capacitor coupled to the first column line of the pixel array via a second switch and configured to store a second reference voltage level of the first pixel based on a second conversion gain of the first pixel, the first and second conversion gains being different from each other; and
- a control circuit configured to:
- control the first switch to couple the first capacitor to the first column line to store the first reference voltage level of the first pixel based on the first conversion gain;
- control the second switch to couple the second capacitor to the first column line;
- control the analog to digital converter to convert, into a first digital value, the second reference voltage level of the first pixel based on the second conversion gain;
- control the analog to digital converter to convert, into a second digital value, a captured voltage level of the first pixel based on the second conversion gain;
- control the analog to digital converter to convert, into a third digital value, the first reference voltage level of the first pixel based on the first conversion gain;
- control the first switch to couple the first capacitor to the first column line; and
- control the analog to digital converter to convert, into a fourth digital value, the captured voltage level of the first pixel based on the first conversion gain.

18. The readout circuit of claim 17, comprising a first comparator, the first capacitor coupled to a first input terminal of the first comparator.

19. The readout circuit of claim 18 wherein an output terminal of the first comparator is coupled to the first input terminal via a switch.

20. The readout circuit of claim 18, comprising an inverter coupled between an output of the first comparator and the control circuit.

* * * * *

UNITED STATES PATENT AND TRADEMARK OFFICE
CERTIFICATE OF CORRECTION

PATENT NO. : 11,258,977 B2  
APPLICATION NO. : 16/703681  
DATED : February 22, 2022  
INVENTOR(S) : Tarek Lule Page 1 of 1

It is certified that error appears in the above-identified patent and that said Letters Patent is hereby corrected as shown below:

In the Claims

Column 17, Claim 6, Line 52:
"having said first pixel." should read: -- having the first pixel. --

Signed and Sealed this
Nineteenth Day of July, 2022

Katherine Kelly Vidal
*Director of the United States Patent and Trademark Office*